United States Patent
Fuke et al.

(10) Patent No.: US 8,624,343 B2
(45) Date of Patent: Jan. 7, 2014

(54) EPOXY RESIN COMPOSITION FOR OPTICAL SEMICONDUCTOR DEVICE, LEAD FRAME FOR OPTICAL SEMICONDUCTOR DEVICE AND SUBSTRATE FOR OPTICAL SEMICONDUCTOR DEVICE OBTAINED USING THE SAME, AND OPTICAL SEMICONDUCTOR DEVICE

(75) Inventors: Kazuhiro Fuke, Osaka (JP); Hidenori Onishi, Osaka (JP); Shinya Ota, Osaka (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 13/564,765

(22) Filed: Aug. 2, 2012

(65) Prior Publication Data
US 2013/0032933 A1    Feb. 7, 2013

(30) Foreign Application Priority Data
Aug. 2, 2011    (JP) .................................. 2011-169178

(51) Int. Cl.
*H01L 31/0203*    (2006.01)

(52) U.S. Cl.
USPC ............................. 257/433; 257/432; 257/100

(58) Field of Classification Search
USPC ............ 257/98, 99, 100, 788, 793, 666, 432, 257/433; 428/35.7, 147, 148
See application file for complete search history.

(56) References Cited

U.S. PATENT DOCUMENTS

| | | | |
|---|---|---|---|
| 8,012,381 B2 * | 9/2011 | Taguchi et al. | 264/1.1 |
| 8,044,128 B2 * | 10/2011 | Sawada et al. | 524/147 |
| 2009/0272995 A1 | 11/2009 | Ito et al. | |
| 2010/0200882 A1 * | 8/2010 | Kotani et al. | 257/98 |
| 2011/0054072 A1 * | 3/2011 | Sawada et al. | 523/353 |
| 2013/0011617 A1 * | 1/2013 | Tasaki et al. | 428/148 |

FOREIGN PATENT DOCUMENTS

JP    200791960 A    4/2007

* cited by examiner

*Primary Examiner* — S. V. Clark
(74) *Attorney, Agent, or Firm* — Sughrue Mion, PLLC

(57) ABSTRACT

The present invention relates to an epoxy resin composition for an optical semiconductor device, including the following ingredients (A) to (E): (A) an epoxy resin; (B) a curing agent; (C) a white pigment; (D) an inorganic filler; and (E) a silane coupling agent, in which a total content of the ingredient (C) and the ingredient (D) is from 69 to 94% by weight of the whole of the epoxy resin composition, and the ingredient (E) is contained in an amount satisfying the specific conditions.

16 Claims, 2 Drawing Sheets

EPOXY RESIN COMPOSITION FOR OPTICAL SEMICONDUCTOR DEVICE, LEAD FRAME FOR OPTICAL SEMICONDUCTOR DEVICE AND SUBSTRATE FOR OPTICAL SEMICONDUCTOR DEVICE OBTAINED USING THE SAME, AND OPTICAL SEMICONDUCTOR DEVICE

FIELD OF THE INVENTION

The present invention relates to an epoxy resin composition for an optical semiconductor device which is used as a material for forming a reflector (reflection part) that reflects light emitted from, for example, an optical semiconductor element. The invention further relates to a lead frame for an optical semiconductor device and a substrate for an optical semiconductor device, obtained using the epoxy resin composition and relates to an optical semiconductor device.

BACKGROUND OF THE INVENTION

Conventional optical semiconductor devices including an optical semiconductor element mounted therein have a configuration including a metallic lead frame 1, an optical semiconductor element 2 mounted thereon, and a reflector 3 for light reflection formed of a resin material so as to surround the periphery of the optical semiconductor element 2, as shown in FIG. 1. Then, a space including the optical semiconductor element 2 surrounded by the reflector 3 is encapsulated with a transparent resin such as a silicone resin. An electrode circuit (not shown) formed in the metallic lead frame 1 and the optical semiconductor element 2 are electrically connected with each other by a bonding wire 4 to be provided according to the need.

Now, an epoxy resin composition is used for encapsulating an optical semiconductor element such as a light emitting diode (LED). In particular, for epoxy resin compositions which are developed with a mind to the use in the surroundings of LED, a material including an aliphatic (alicyclic) hydrocarbon as a main structure is used as an epoxy resin capable of making the absorption in a visible light short wavelength region low (see Patent Document 1).
Patent Document 1: JP-A-2007-91960

SUMMARY OF THE INVENTION

In the optical semiconductor devices as described above, it is known to add a filler as a method for decreasing a linear expansion coefficient. However, there is involved such a problem that if the content of the filler is increased, though the strength increases, the optical semiconductor device becomes brittle. In particular, since the epoxy resin including an aliphatic (alicyclic) hydrocarbon as a main structure, which is used in the above-referenced Patent Document 1, is relatively poor in toughness, if a large amount of the filler is added to the material of the above-referenced Patent Document 1, there is involved such a problem that the optical semiconductor device becomes remarkably brittle.

Under these circumstances, the invention has been made. An object of the invention is to provide an epoxy resin composition for an optical semiconductor device, which is able to satisfy both low linear expansion coefficient and strength; a lead frame for an optical semiconductor device and a substrate for an optical semiconductor device, obtained using the same; and an optical semiconductor device.

Namely, the present invention relates to the following items 1 to 16.

1. An epoxy resin composition for an optical semiconductor device, including the following ingredients (A) to (E), in which a total content of the ingredient (C) and the ingredient (D) is from 69 to 94% by weight of the whole of the epoxy resin composition, and the ingredient (E) is contained in an amount satisfying the following numerical formula (1):
   (A) an epoxy resin;
   (B) a curing agent;
   (C) a white pigment;
   (D) an inorganic filler; and
   (E) a silane coupling agent, $$\frac{Z_1 \times Z_2}{X_1 \times X_2 + Y_1 \times Y_2} \times 100 = 1 \sim 190\% \qquad (1)$$

in which $X_1$ represents a BET specific surface area ($m^2/g$) of the ingredient (C); $X_2$ represents a content (g) of the ingredient (C); $Y_1$ represents a BET specific surface area ($m^2/g$) of the ingredient (D); $Y_2$ represents a content (g) of the ingredient (D); $Z_1$ represents a minimum coverage area ($m^2/g$) of the ingredient (E); and $Z_2$ represents a content (g) of the ingredient (E), provided that when a plurality of each of the ingredients (C) to (E) is contained, the designated value is a total value thereof.

2. The epoxy resin composition for an optical semiconductor device according to item 1, in which a cured material of the epoxy resin composition for an optical semiconductor device has a light reflectivity of 80% or more in a wavelength range of from 430 to 800 nm.

3. The epoxy resin composition for an optical semiconductor device according to item 1 or 2, in which the ingredient (E) is a silane coupling agent represented by the following general formula (1):

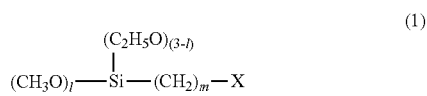

(1)

in which X represents a glycidyl group, a cyclohexene oxide group, a thiol group or an amino group; m represents any of 1, 2 or 3; and l represents any of 0, 1, 2 or 3.

4. The epoxy resin composition for an optical semiconductor device according to any one of items 1 to 3, in which a cured material of the epoxy resin composition for an optical semiconductor device has a flexural strength of 60 MPa or more and a flexural elastic modulus of 10 GPa or more.

5. The epoxy resin composition for an optical semiconductor device according to any one of items 1 to 4, in which the ingredient (C) is titanium dioxide.

6. The epoxy resin composition for an optical semiconductor device according to any one of items 1 to 5, in which the ingredient (A) is an epoxy resin having an isocyanurate ring structure.

7. The epoxy resin composition for an optical semiconductor device according to any one of items 1 to 6, in which the ingredient (B) is an acid anhydride curing agent.

8. The epoxy resin composition for an optical semiconductor device according to any one of items 1 to 7, further including a curing accelerator as an ingredient (F).

9. A lead frame for an optical semiconductor device, the lead frame having an optical semiconductor element mounding region and having a reflector that surrounds at least a part of the region, in which the reflector is formed from the epoxy resin composition for an optical semiconductor device according to any one of items 1 to 8.

10. The lead frame for an optical semiconductor device according to item 9, in which the reflector is formed on only one surface of the lead frame for an optical semiconductor device.

11. The lead frame for an optical semiconductor device according to item 9 or 10, in which the reflector is formed by transfer molding.

12. A substrate for an optical semiconductor device, the substrate having an optical semiconductor element mounding region and having a reflector that surrounds at least a part of the region, in which the reflector is formed from the epoxy resin composition for an optical semiconductor device according to any one of items 1 to 8.

13. The substrate for an optical semiconductor device according to item 12, in which the reflector is formed on only one surface of the substrate for an optical semiconductor device.

14. The substrate for an optical semiconductor device according to item 12 or 13, in which the reflector is formed by transfer molding.

15. An optical semiconductor device including:
the lead frame for an optical semiconductor device according to any one of items 9 to 11; and
an optical semiconductor element mounted on a prescribed position in the lead frame.

16. An optical semiconductor device including:
the substrate for an optical semiconductor device according to any one of items 12 to 14; and
an optical semiconductor element mounted on a prescribed position in the substrate.

That is, in order to obtain an optical semiconductor device capable of contriving to satisfy both low linear expansion coefficient and strength, the present inventors made extensive and intensive investigations. In the process of research, the present inventors have paid attention to a silane coupling agent as a surface modifier and found that by using the silane coupling agent [ingredient (E)] in combination with the epoxy resin [ingredient (A)], the curing agent [ingredient (B)], the white pigment [ingredient (C)], and the inorganic filler [ingredient (D)] and regulating a total content of the ingredient (C) and the ingredient (D) to from 69 to 94% by weight of the epoxy resin composition and also regulating a content of the silane coupling agent [ingredient (E)] to a value satisfying a surface coverage (from 1 to 190%) expressed by the foregoing numerical formula (1), an optical semiconductor device using this epoxy resin composition does not become brittle and is able to contrive to satisfy both low linear expansion coefficient and strength, leading to accomplishment of the invention.

In the light of the above, the epoxy resin composition for an optical semiconductor device of the invention (hereinafter also referred to as "epoxy resin composition") uses the silane coupling agent [ingredient (E)] as a surface modifier in combination with the epoxy resin [ingredient (A)], the curing agent [ingredient (B)], the white pigment [ingredient (C)], and the inorganic filler [ingredient (D)]. In addition, not only the total content of the ingredient (C) and the ingredient (D) is regulated to from 69 to 94% by weight of the epoxy resin composition, but the content of the ingredient (E) is regulated to a value satisfying the surface coverage (from 1 to 190%) expressed by the foregoing numerical formula (1). Therefore, the surfaces of the white pigment [ingredient (C)] and the inorganic filler [ingredient (D)] are modified with the silane coupling agent [ingredient (E)], and an optical semiconductor device using this epoxy resin composition does not become brittle and is able to contrive to satisfy both low linear expansion coefficient and strength.

Then, the epoxy resin composition of the invention becomes a material for forming a reflector that reflects light emitted from an optical semiconductor element. Therefore, in an optical semiconductor device having a reflector formed therein by using the foregoing epoxy resin composition, when the foregoing reflector is used, breakage or crack of the reflector to be caused during the fabrication of an LED package can be reduced or prevented from occurring, and hence, the optical semiconductor device can be mass-produced more inexpensively.

DETAILED DESCRIPTION OF THE INVENTION

Figure 1:
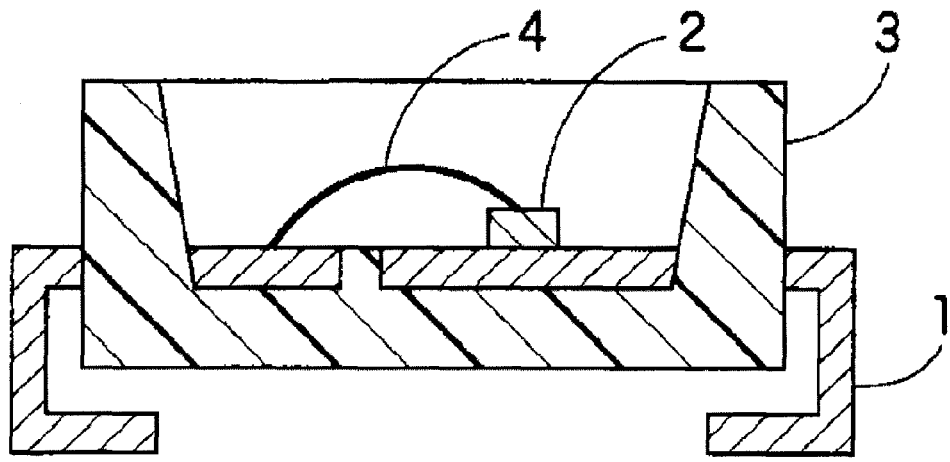
FIG. 1 is a sectional view schematically showing a configuration of an optical semiconductor device of the invention.

The epoxy resin composition of the invention is obtained using an epoxy resin (ingredient (A)), a curing agent (ingredient (B)), a white pigment (ingredient (C)), an inorganic filler (ingredient (D)) and a silane coupling agent (ingredient (E)), and is usually used for an encapsulating material in a liquid or powdered form or in a tablet form obtained by tableting the powder. The epoxy resin composition of the invention is preferably used as a material for forming a reflector 3 of the optical semiconductor device shown in FIG. 1.

Most important characteristic features of the invention is that a total content of the white pigment (ingredient (C)) and the inorganic filler (ingredient (D)) is from 69 to 94% by weight of the whole of the epoxy resin composition; and that the silane coupling agent (ingredient (E)) is contained in an amount satisfying the foregoing numerical formula (1).

First of all, each of the ingredients of the epoxy resin composition of the invention is described.

Examples of the epoxy resin (ingredient (A)) which is used for the epoxy resin composition of the invention include bisphenol A type epoxy resins, bisphenol F type epoxy resins, novolac type epoxy resins such as phenol novolac type epoxy resins and cresol novolac type epoxy resins, alicyclic epoxy resins, nitrogen-containing ring epoxy resins such as triglycidyl isocyanurate resins and hydantoin type epoxy resins, hydrogenated bisphenol A type epoxy resins, aliphatic epoxy resins, glycidyl ether type epoxy resins, bisphenol S type epoxy resins, biphenyl type epoxy resins which are mainly used as the type giving cured resins with a low water absorption, dicyclic epoxy resins, and naphthalene type epoxy resins. These may be used alone or in combination of two or more kinds thereof. Of these, epoxy resins having an isocyanurate ring structure, such as triglycidyl isocyanurate resins, are preferable from the viewpoints of heat resistance and light resistance.

The epoxy resin (ingredient (A)) may be a solid or a liquid at ordinary temperature. However, in general, the epoxy resin to be used is preferably one having an average epoxy equivalent of from 90 to 1,000. In addition, in the case of a solid epoxy resin, an epoxy resin having a softening point of 160° C. or less is preferable. When the epoxy equivalent is too low, there is a tendency that an epoxy resin composition cured material becomes brittle; whereas when the epoxy equivalent is too high, there is a tendency that a glass transition temperature (Tg) of an epoxy resin composition cured material becomes low.

Examples of the curing agent (ingredient (B)) include acid anhydride curing agents, isocyanuric acid derivative curing agents, phenolic curing agents, amine curing agents, curing agents obtained by partially esterifying the foregoing acid anhydride curing agents with an alcohol, and carboxylic acids such as hexahydrophthalic acid, tetrahydrophthalic acid, and methylhexahydrophthalic acid. These may be used alone or in combination of two or more kinds thereof. Of these, acid anhydride curing agents are preferable from the viewpoints of heat resistance and light resistance.

Examples of the acid anhydride curing agent include phthalic anhydride, maleic anhydride, trimellitic anhydride, pyromellitic anhydride, hexahydrophthalic anhydride, tetrahydrophthalic anhydride, methylnadic anhydride, nadic anhydride, glutaric anhydride, methylhexahydrophthalic anhydride, and methyltetrahydrophthalic anhydride. Of these, it is preferable to use phthalic anhydride, hexahydrophthalic anhydride, tetrahydrophthalic anhydride, or methylhexahydrophthalic anhydride. Furthermore, the acid anhydride curing agent is preferably an acid anhydride curing agent having a molecular weight of from about 140 to 200, and a colorless or pale yellow acid anhydride curing agent is preferable.

In addition, examples of the isocyanuric acid derivative curing agent include 1,3,5-tris(1-carboxymethyl)isocyanurate, 1,3,5-tris(2-carboxyethyl)isocyanurate, 1,3,5-tris(3-carboxypropyl)isocyanurate, and 1,3-bis(2-carboxyethyl)isocyanurate.

Here, a blending proportion of the epoxy resin (ingredient (A)) and the curing agent (ingredient (B)) is set such that an amount of an active group (an acid anhydride group or a carboxyl group) in the curing agent (ingredient (B)), which is capable of reacting with an epoxy group, is preferably from 0.5 to 1.5 equivalents, and especially preferably from 0.7 to 1.2 equivalents to one equivalent of epoxy group in the epoxy resin (ingredient (A)). When the amount of the active group is too low, there is a tendency that not only a curing rate of the epoxy resin composition becomes slow, but a glass transition temperature (Tg) of a cured material thereof becomes low; whereas when the amount of the active group is too high, there is a tendency that the moisture resistance is lowered.

Next, examples of the white pigment (ingredient (C)) which is used in combination with the foregoing ingredient (A) and ingredient (B) include inorganic white pigments such as magnesium oxide, antimony oxide, titanium dioxide, zirconium oxide, zinc oxide, white lead, kaolin, alumina, calcium carbonate, barium carbonate, barium sulfate, zinc sulfate, and zinc sulfide. These may be used alone or in combination of two or more kinds thereof. Of these, it is preferable to use titanium dioxide from the viewpoint that an excellent light reflectivity is obtainable. It is especially preferable to use titanium dioxide having a rutile type crystal structure. Furthermore, from the viewpoints of flowability and light shielding properties, it is preferable to use titanium dioxide of a rutile type having an average particle diameter of from 0.05 to 2.0 μm. From the viewpoint of light reflecting properties, the average particle diameter thereof is especially preferably from 0.08 to 0.5 μm. Incidentally, the average particle diameter can be measured with, for example, a laser diffraction/scattering particle size distribution analyzer.

Incidentally, a content of the white pigment (ingredient (C)) in the invention is set within a range as described later.

Examples of the inorganic filler (ingredient (D)) which is used in combination with the foregoing ingredients (A) to (C) include a quartz glass powder, talc, silica powders such as a fused silica powder and a crystalline silica powder, an aluminum nitride powder, and a silicon nitride powder. These may be used alone or in combination of two or more kinds thereof. Of these, it is preferable to use a silica powder from the viewpoint of reducing the linear expansion coefficient, or the like. It is especially preferable to use a spherical fused silica powder from the viewpoints of high filling properties and high flowability. With respect to the particle diameter and particle diameter distribution of the inorganic filler (ingredient (D)), it is preferable to set the particle diameter and distribution thereof while taking into consideration a combination thereof with the particle diameter and particle diameter distribution of the white pigment (ingredient (C)) so as to minimize the occurrence of burrs and the like when the epoxy resin composition is molded by transfer molding or the like. Specifically, it is preferable to allow an average particle diameter of the inorganic filler (ingredient (D)) to fall within the range of from 5 to 60 μm.

In the invention, it is necessary that a total content of the foregoing white pigment (ingredient (C)) and inorganic filler (ingredient (D)) is from 69 to 94% by weight of the whole of the epoxy resin composition. The total content is preferably from 75 to 94% by weight, and especially preferably from 80 to 94% by weight. When the total content is too low, a flexural elastic modulus and a light reflectivity are inferior, and a reduction of the linear expansion coefficient is hardly achieved; whereas when the total content is too high, an epoxy resin composition is hardly fabricated by means of kneading or the like because of remarkable thickening.

Here, a content of the white pigment (ingredient (C)) is preferably from 2 to 40% by weight, more preferably from 5 to 30% by weight, and especially preferably from 15 to 30% by weight of the whole of the epoxy resin composition. In addition, a content of the inorganic filler (ingredient (D)) is preferably a value obtained by subtracting the content of the white pigment (ingredient (C)) from the total content of the white pigment (ingredient (C)) and the inorganic filler (ingredient (D)).

In the epoxy resin composition of the invention, a characteristic feature is that the silane coupling agent (ingredient (E)) is used in a specified proportion in combination with the foregoing ingredients (A) to (D). The silane coupling agent (ingredient (E)) is preferably a silane coupling agent represented by the following general formula (1) from the viewpoint that it is able to chemically react with the epoxy resin (ingredient (A)) without a particular inhibition reaction.

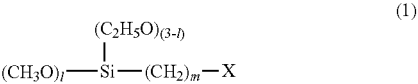

(1)

In the general formula (1), X represents a glycidyl group, a cyclohexene oxide group, a thiol group, or an amino group; m represents any of 1, 2 or 3; and l represents any of 0, 1, 2 or 3.

Specific examples of the silane coupling agent represented by the foregoing general formula (1) include 3-mercaptopropyl trimethoxysilane, 3-glycidoxypropyl trimethoxysilane, and 2-(3,4-epoxycyclohexyl)ethyl trimethoxysilane.

A content of the silane coupling agent (ingredient (E)) is preferably from 0.01 to 2.4% by weight, and more preferably from 0.1 to 2.0% by weight of the whole of the epoxy resin composition.

In the invention, the content ($Z_2$) of the silane coupling agent (ingredient (E)) is regulated such that a surface coverage expressed by the following numerical formula (1) is from 1 to 190%, preferably from 5 to 170%, and more preferably from 10 to 150%. In the content in which the surface coverage is less than the lower limit, sufficient strength is not obtained; whereas in the content in which the surface coverage exceeds the upper limit, Tg of the epoxy resin composition is lowered.

Incidentally, the surface coverage as referred to in the invention means a value expressed by the following numerical formula (1). In more detail, the surface coverage expresses a ratio of a specific surface area of the silane coupling agent (ingredient (E)) to a total of specific surface areas of the white pigment (ingredient (C)) and the inorganic filler (ingredient (D)).

$$\frac{Z_1 \times Z_2}{X_1 \times X_2 + Y_1 \times Y_2} \times 100 = 1 \sim 190\% \quad (1)$$

In the numerical formula (1), $X_1$ represents a BET specific surface area (m²/g) of the ingredient (C); $X_2$ represents a content (g) of the ingredient (C); $Y_1$ represents a BET specific surface area (m²/g) of the ingredient (D); $Y_2$ represents a content (g) of the ingredient (D); $Z_1$ represents a minimum coverage area (m²/g) of the ingredient (E); and $Z_2$ represents a content (g) of the ingredient (E), provided that when a plurality of each of the ingredients (C) to (E) is used, the designated value is a total value thereof.

In the foregoing numerical formula (1), the BET specific surface area ($X_1$) of the white pigment (ingredient (C)) is preferably in the range of from 2 to 70 m²/g, and especially preferably in the range of from 5 to 60 m²/g. In addition, the BET specific surface area ($Y_1$) of the inorganic filler (ingredient (D)) is preferably in the range of from 0.1 to 10 m²/g, and especially preferably in the range of from 1 to 8 m²/g.

In addition, the minimum coverage area ($Z_1$) of the silane coupling agent (ingredient (E)) is preferably in the range of from 100 to 1,000 m²/g, and especially preferably in the range of from 150 to 500 m²/g.

Incidentally, the minimum coverage area ($Z_1$) of the silane coupling agent (ingredient (E)) is expressed by the following numerical formula (2).

$$\text{Minimum coverage area } (Z_1) = \frac{6.02 \times 10^{23} \times 13 \times 10^{-20}}{\text{Molecular weight of the ingredient } (E)} \quad (2)$$

In the foregoing numerical formula (2), the molecular weight of the silane coupling agent (ingredient (E)) is preferably in the range of from 100 to 1,000, and especially preferably in the range of from 100 to 500.

Incidentally, in the foregoing numerical formula (1), each of the content ($X_2$) of the white pigment (ingredient (C)), the content ($Y_2$) of the inorganic filler (ingredient (D)), and the content ($Z_2$) of the silane coupling agent (ingredient (E)) is preferably in the range satisfying the foregoing content (% by weight) of each ingredient in the whole of the epoxy resin composition.

In addition to the foregoing ingredients (A) to (E), various additives such as a curing accelerator (ingredient (F)), a modifier, a flame retardant, an antioxidant, a defoaming agent, a leveling agent, and a release agent can be properly blended in the epoxy resin composition of the invention according to the need.

Examples of the curing accelerator (ingredient (F)) include tertiary amines such as 1,8-diaza-bicyclo[5.4.0]undecene-7, triethylenediamine, tri-2,4,6-dimethylaminomethylphenol, N,N-dimethylbenzylamine, N,N-dimethylaminobenzene, and N,N-dimethylaminocyclohexane; imidazoles such as 2-ethyl-4-methylimidazole and 2-methylimidazole; phosphorus compounds such as triphenylphosphine, tetraphenylphosphonium tetraphenylborate, tetra-n-butylphosphonium tetrafluoroborate, methyltri-n-butylphosphonium dimethylphosphate and tetra-n-butylphosphonium-o,o-diethylphosphorodithioate; quaternary ammonium salts; organic metal salts; and derivatives thereof. These may be used alone or in combination of two or more kinds thereof. Of these, it is preferable to use a tertiary amine, an imidazole, or a phosphorus compound. Above all, in order to obtain a cured material which has a low degree of coloration and is transparent and tough, it is especially preferable to use a phosphorus compound.

A content of the curing accelerator (ingredient (F)) is set to preferably from 0.001 to 8.0% by weight, and especially preferably from 0.01 to 3.0% by weight relative to the epoxy resin (ingredient (A)). When the content of the curing accelerator (ingredient (F)) is too low, there is a concern that a sufficient curing acceleration effect is not obtained; whereas when the content of the curing accelerator (ingredient (F) is too high, there is a tendency that the obtained cured material causes discoloration.

Examples of the flame retardant include metal hydroxide compounds such as magnesium hydroxide, bromine based flame retardants, nitrogen based flame retardants and phosphorus based flame retardants. Furthermore, a flame retardant aid such as antimony trioxide can be used, too.

Examples of the modifier include glycols, silicones and alcohols.

Examples of the antioxidant include hindered phenol based antioxidants, phosphorus based antioxidants, and sulfide based antioxidants. These may be used alone or in combination of two or more kinds thereof. Of these, it is preferable to use a hindered phenol based antioxidant from the standpoint of thermal discoloration resistance.

Examples of the defoaming agent include silicone based defoaming agents.

The epoxy resin composition of the invention can be, for example, manufactured in the following manner. That is, the foregoing ingredients (A) to (E) and optionally, the curing accelerator (ingredient (F)) and furthermore, the foregoing various additives to be blended according to the need are properly blended. Thereafter, these ingredients are kneaded and melt mixed using a kneader, followed by pulverization. There can be thus manufactured an epoxy resin composition in a powdered form.

In the epoxy resin composition of the invention, it is preferable that a cured material thereof has the following flexural characteristics. That is, a flexural strength thereof is preferably 60 MPa or more, especially preferably 80 MPa or more, and most preferably 100 MPa or more; and a flexural elastic modulus thereof is preferably 10 GPa or more, especially preferably 15 GPa or more, and most preferably 20 GPa or more.

The foregoing flexural strength and flexural elastic modulus are, for example, measured in the following manner. That is, a cured material of an epoxy resin composition having a thickness of 4 mm is manufactured under prescribed curing conditions, for example, molding at 175° C. for 2 minutes and subsequent curing at 175° C. for 2 hours to fabricate a test piece (cured material). The flexural strength and the flexural elastic modulus of this cured material can be measured with an analyzer (for example, AG-500, manufactured by Shimadzu Corporation) at ordinary temperature (20° C.±15° C.) according to JIS-K7171.

In addition, in the cure material of the epoxy resin composition of the invention, a linear expansion coefficient in a temperature region of the glass transition temperature (Tg) or less is preferably 28 ppm/K or less, especially preferably 25 ppm/K or less, and most preferably 20 ppm/K or less.

The foregoing linear expansion coefficient is, for example, measured in the following manner. That is, a cured material of an epoxy resin composition having a thickness of 5 mm is manufactured under prescribed curing conditions, for example, molding at 175° C. for 2 minutes and subsequent curing at 175° C. for 3 hours to fabricate a test piece (cured material). The linear expansion coefficient of this cured material can be measured with an analyzer (for example, TMA-50, manufactured by Shimadzu Corporation) at a temperature elevation rate of 2° C./min.

In addition, in the cure material of the epoxy resin composition of the invention, a light reflectivity is preferably 80% or more, and especially preferably 85% or more in a wavelength range of from 430 to 800 nm. Incidentally, an upper limit thereof is usually 100%.

The foregoing light reflectivity is, for example, measured in the following manner. That is, a cured material of an epoxy resin composition having a thickness of 1 mm is fabricated under prescribed curing conditions, for example, molding at 150° C. for 4 minutes and subsequent curing at 150° C. for 5 hours. The light reflectivity of this cured material at a wavelength within the foregoing range can be measured with a spectrophotometer (for example, a spectrophotometer V-670, manufactured by JASCO Corporation) at room temperature (20° C.±15° C.).

The optical semiconductor device using the epoxy resin composition of the invention is, for example, manufactured in the following manner. That is, a metallic lead frame is disposed within a die of a transfer molding machine, and a reflector is formed using the epoxy resin composition by transfer molding. In this way, a metallic lead frame for an optical semiconductor device in which the reflector is formed in a state of surrounding the periphery of an optical semiconductor element mounting region is formed. Subsequently, an optical semiconductor element is mounted in the optical semiconductor element mounting region on the metallic lead frame, which is located in the inside of the reflector, and wire bonding is performed according to the need. There is thus fabricated an optical semiconductor device as a unit equipped with a metallic lead frame 1 in which a reflector 3 is formed in a state of surrounding the periphery of an optical semiconductor element 2 to be mounted; and the optical semiconductor element 2 mounted on the metallic lead frame 1, as shown in FIG. 1. An electrode circuit (not shown) formed on the metallic lead frame 1 and the optical semiconductor element 2 are electrically connected with each other by a bonding wire 4. In the foregoing optical semiconductor device, a region which is located in the inside of the reflector 3 including the optical semiconductor element 2 is encapsulated with a silicone resin or the like.

Figure 2:
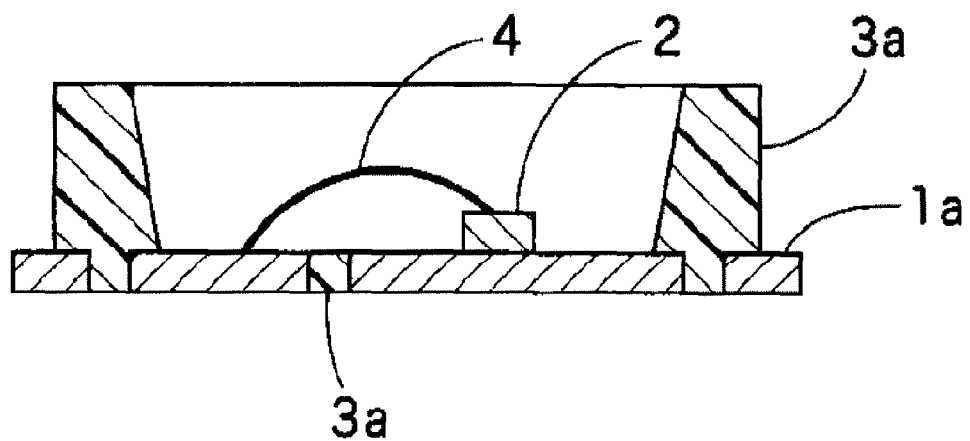
FIG. 2 is a sectional view schematically showing another configuration of an optical semiconductor device of the invention.
Figure 3:
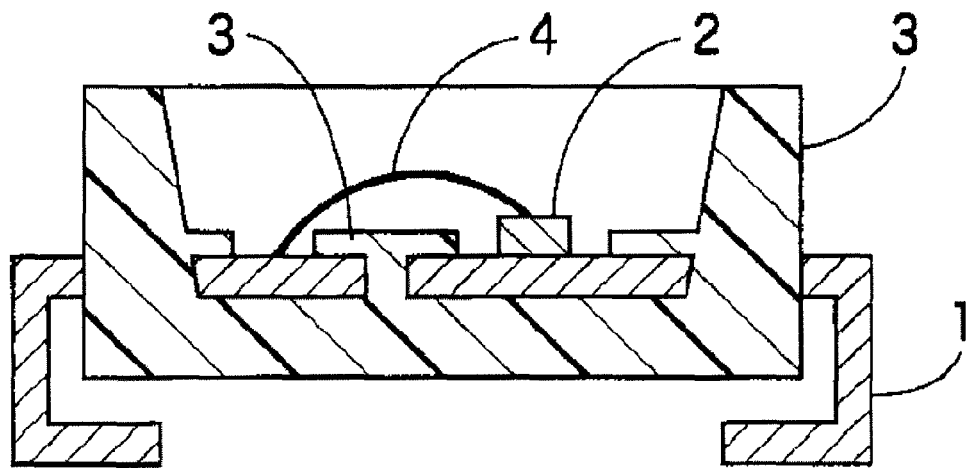
FIG. 3 is a sectional view schematically showing still another configuration of an optical semiconductor device of the invention.
Figure 4:
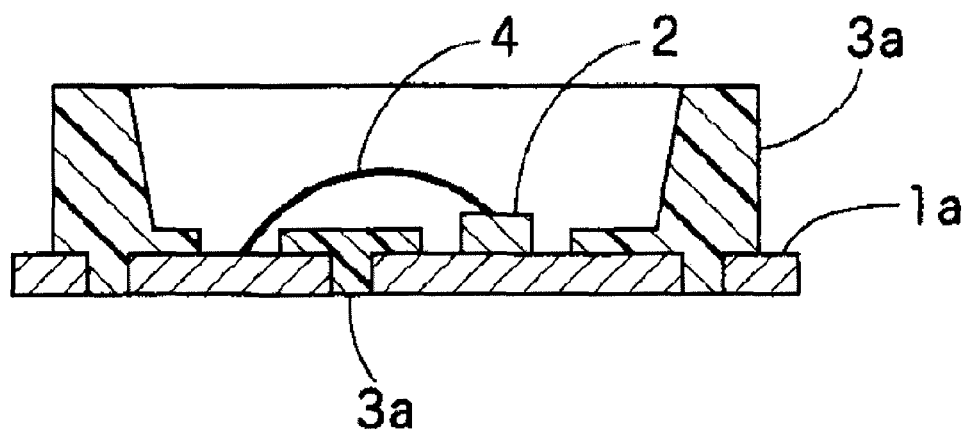
FIG. 4 is a sectional view schematically showing yet still another configuration of an optical semiconductor device of the invention.

Furthermore, other configurations of the optical semiconductor device are shown in FIG. 2 to FIG. 4. In an optical semiconductor device shown in FIG. 2, a reflector 3a is formed on only one surface of a metallic lead frame 1a (or a substrate) on which an optical semiconductor element 2 is mounted, and the metallic lead frame 1a (or the substrate) is exposed on the rear surface side. In addition, an optical semiconductor device shown in FIG. 3 has substantially the same configuration as that of the optical semiconductor device shown in FIG. 1; however, a reflector 3 is also formed on a metallic lead frame 1 at the periphery of an optical semiconductor element 2 in the inner region of the reflector 3. Then, an optical semiconductor device shown in FIG. 4 has substantially the same configuration as that of the optical semiconductor device shown in FIG. 2; however, a reflector 3a is also formed on a metallic lead frame 1a (or a substrate) at the periphery of an optical semiconductor element 2 in the inner region of the reflector 3a. Incidentally, in the configurations of the optical semiconductor devices shown in FIG. 2 to FIG. 4, the same parts as those in the optical semiconductor device shown in FIG. 1 are designated by the same numerals and signs.

Incidentally, in the invention, in the optical semiconductor devices shown in the foregoing FIG. 2 and FIG. 4, various substrates may be used in place of the metallic lead frame 1a. Examples of the various substrates include organic substrates, inorganic substrates and flexible printed substrates. Then, in the metallic lead frames 1a of the optical semiconductor devices shown in the foregoing FIG. 2 and FIG. 4 and the various substrates, an electrode circuit (not shown) is formed on the surface thereof.

EXAMPLES

Next, Examples are given below together with Comparative Examples. However, it should not be construed that the invention is limited to these Examples.

First of all, prior to the fabrication of epoxy resin compositions, materials shown below were prepared.

[Epoxy Resin (A)]
Triglycidyl isocyanurate (epoxy equivalent: 100)

[Curing Agent (B)]
4-Methylhexahydrophthalic anhydride (acid equivalent: 168)

[White Pigment (C)]
Rutile type titanium dioxide [average particle diameter: 0.21 μm, BET specific surface area ($X_1$): 9.0 m$^2$/g]

[Inorganic Filler (D)]
Spherical fused silica [average particle diameter: 22 μm, BET specific surface area ($Y_1$): 3.2 m$^2$/g]

[Silane Coupling Agent (E)]
3-Glycidoxypropyl trimethoxysilane [minimum coverage area ($Z_1$): 330 m$^2$/g]

[Curing Accelerator (F)]
Tetra-n-butylphosphonium-o,o-diethylphosphorodithioate

Examples 1 to 7 and Comparative Examples 1 to 4

Respective ingredients shown in each of the following Tables 1 and 2 were blended in proportions shown in each of these tables and melt mixed in a beaker. After the mixture was aged, the resulting mixture was cooled to room temperature (25° C.) and pulverized to fabricate an epoxy resin composition in a powdered form.

TABLE 1

| | Example (% by weight) | | | | | | |
|---|---|---|---|---|---|---|---|
| | 1 | 2 | 3 | 4 | 5 | 6 | 7 |
| Epoxy resin (A) | 4.37 | 4.26 | 4.02 | 3.81 | 10.94 | 7.24 | 3.51 |
| Curing agent (B) | 7.34 | 7.16 | 6.76 | 6.40 | 18.39 | 12.17 | 5.89 |
| Curing accelerator (F) | 0.04 | 0.04 | 0.04 | 0.04 | 0.11 | 0.07 | 0.04 |
| Silane coupling agent (E) | 0.30 | 0.60 | 1.20 | 1.81 | 0.52 | 0.56 | 0.61 |
| Content ($Z_2$) (g) | 0.44 | 0.89 | 1.77 | 2.66 | 1.03 | 0.94 | 0.87 |
| Inorganic filler (D) | 67.97 | 67.96 | 67.98 | 67.99 | 50.02 | 59.97 | 69.96 |
| Content ($Y_2$) (g) | 100 | 100 | 100 | 100 | 100 | 100 | 100 |
| White pigment (C) | 19.98 | 19.98 | 19.99 | 19.96 | 20.03 | 19.99 | 19.99 |
| Content ($X_2$) (g) | 29 | 29 | 29 | 29 | 40 | 33 | 29 |
| Total content of (C) and (D) | 87.94 | 87.94 | 87.97 | 87.95 | 70.04 | 79.95 | 89.95 |
| Surface coverage (%) | 25 | 50 | 100 | 150 | 50 | 50 | 50 |
| Flexural strength (MPa) | 110 | 110 | 110 | 130 | 84 | 125 | 64 |
| Flexural elastic modulus (GPa) | 26 | 27 | 26 | 27 | 10 | 17 | 30 |
| Linear expansion coefficient (ppm/K) | 10 | 10 | 10 | 10 | 28 | 16 | 10 |
| Light reflectivity (%) | 85 | 84 | 85 | 84 | 88 | 89 | 90 |

TABLE 2

| | Comparative Example (% by weight) | | | |
|---|---|---|---|---|
| | 1 | 2 | 3 | 4 |
| Epoxy resin (A) | 4.46 | 3.60 | 1.65 | 18.42 |
| Curing agent (B) | 7.50 | 6.04 | 2.77 | 30.95 |
| Curing accelerator (F) | 0.04 | 0.04 | 0.02 | 0.18 |
| Silane coupling agent (E) | — | 2.41 | 0.64 | 0.42 |
| Content ($Z_2$) (g) | — | 3.54 | 0.85 | 1.39 |
| Inorganic filler (D) | 68.01 | 67.96 | 74.96 | 30.03 |
| Content ($Y_2$) (g) | 100 | 100 | 100 | 100 |
| White pigment (C) | 19.99 | 19.96 | 19.97 | 19.99 |
| Content ($X_2$) (g) | 29 | 29 | 27 | 67 |
| Total content of C and D | 88.00 | 87.92 | 94.93 | 50.02 |
| Surface coverage (%) | 0 | 200 | 50 | 50 |
| Flexural strength (MPa) | 59 | Could not be cured | Could not be fabricated | 93 |
| Flexural elastic modulus (GPa) | 27 | | | 7 |
| Linear expansion coefficient (ppm/K) | 10 | | | 40 |
| Light reflectivity (%) | 86 | | | 88 |

Respective characteristics of each of the thus obtained epoxy resin compositions of the Examples and Comparative Examples were evaluated according to the following methods. Results are also shown in each of the foregoing Tables 1 and 2.

[Flexural Test (Flexural Strength and Flexural Elastic Modulus)]

Each of the foregoing epoxy resin compositions was cured under prescribed curding conditions (conditions: molding at 175° C. for 2 minutes and subsequent curing at 175° C. for 3 hours) to fabricate a test piece having a thickness of 4 mm, a width of 10 mm, and a length of 80 mm. This test piece (cured material) was subjected to a flexural test (for flexural strength and flexural elastic modulus) according to JIS-K7171:2008. Incidentally, AG-500, manufactured by Shimadzu Corporation was used as an analyzer, and the measurement was performed at ordinary temperature (20° C.). It is preferable that the flexural strength is 60 MPa or more; and it is preferable that the flexural elastic modulus is 10 GPa or more.

[Linear Expansion Coefficient (in a Temperature Region of not Higher than Tg)]

Each of the foregoing epoxy resin compositions was cured under prescribed curding conditions (conditions: molding at 175° C. for 2 minutes and subsequent curing at 175° C. for 3 hours) to fabricate a test piece having a thickness of 5 mm, a width of 5 mm, and a length of 30 mm. The linear expansion coefficient of this cured material in a temperature region of not higher than Tg of the epoxy resin composition cure material was measured with an analyzer (TMA-50, manufactured by Shimadzu Corporation) at a temperature elevation rate of 2° C./min. Incidentally, it is preferable that the linear expansion coefficient is not more 28 ppm/K.

[Light Reflectivity]

Each of the foregoing epoxy resin compositions was cured under prescribed curding conditions (conditions: molding at 175° C. for 2 minutes and subsequent curing at 175° C. for 3 hours) to fabricate a test piece having a thickness of 1 mm. This test piece (cured material) was measured for an initial light reflectivity. Incidentally, a spectrophotometer V-670, manufactured by JASCO Corporation was used as an analyzer, and the light reflectivity at a wavelength of 450 nm was measured at room temperature (25° C.). Incidentally, it is preferable that the light reflectivity is 80% or more.

It was confirmed from the results of the foregoing tables that in all of the test pieces of the Examples, not only the total content of the ingredient (C) and the ingredient (D) is regulated to the prescribed range, but the content of the silane coupling agent is regulated such that the surface coverage falls within the prescribed range, and therefore, not only a favorable light reflectivity is revealed, but both low linear expansion coefficient and strength can be contrived to be satisfied.

On the other hand, in the test piece of Comparative Example 1, the flexural strength was inferior because the silane coupling agent was not blended.

In the test piece of Comparative Example 2, the epoxy resin composition was not cured because the content of the silane coupling agent was so high that the surface coverage was too high.

In the test piece of Comparative Example 3, since the total content of the ingredient (C) and the ingredient (D) was too high, kneading became difficult due to remarkable thickening, and the epoxy resin composition could not be fabricated.

In the test piece of Comparative Example 4, since the total content of the ingredient (C) and the ingredient (D) was too low, the flexural elastic modulus was low, and the linear expansion coefficient was also high.

Next, the epoxy resin composition in a finely powdered form as the test piece of each of the foregoing Examples was used to manufacture an optical semiconductor light emitting device having the configuration shown in FIG. 1. That is, a lead frame 1 made 20 of Alloy 42 (plated with Ag) was charged in a transfer molding machine, and transfer molding (molding conditions: molding at 175° C. for 2 minutes and subsequent curing at 175° C. for 2 hours) was performed. There was thus prepared the optical semiconductor light emitting device shown in FIG. 1, in which a reflector 3, a concave formed in the reflector 3, and a metallic lead frame 1 provided within the concave were manufactured, 25 an optical semiconductor element 2 (size: 0.3 mm×0.3 mm) was mounted within the concave, and an electrode circuit formed on the metallic lead frame 1 and the optical semiconductor element 2 were electrically connected with each other by a bonding wire 4. Finally, a liquid silicone encapsulating agent was poured and cured to manufacture an optical semiconductor light emitting device as a unit equipped with the reflector 3, the concave formed in the reflector 3, the metallic lead frame 1 provided within the concave, and the optical semiconductor element 2 mounted on the metallic lead frame 1, as shown in FIG. 1. There was thus obtained an optical semiconductor light emitting device having no problem.

While the invention has been described in detail with reference to specific embodiments thereof, it will be apparent to one skilled in the art that various changes and modifications can be made therein without departing from the spirit and scope thereof.

Incidentally, the present application is based on Japanese Patent Application No. 2011-169178 filed on Aug. 2, 2011, and the contents are incorporated herein by reference.

All references cited herein are incorporated by reference herein in their entirety.

The epoxy resin composition for an optical semiconductor device of the invention is useful, for example, as a material for forming a reflector that reflects light emitted from an optical semiconductor element mounted in an optical semiconductor device encapsulated with a silicone resin.

DESCRIPTION OF REFERENCE NUMERALS AND SIGNS

1: Metallic lead frame
2: Optical semiconductor element
3: Reflector
4: Bonding wire

What is claimed is:

1. An epoxy resin composition for an optical semiconductor device, comprising the following ingredients (A) to (E), wherein a total content of the ingredient (C) and the ingredient (D) is from 69 to 94% by weight of the whole of the epoxy resin composition, and the ingredient (E) is contained in an amount satisfying the following numerical formula (1):
(A) an epoxy resin;
(B) a curing agent;
(C) a white pigment;
(D) an inorganic filler; and
(E) a silane coupling agent, $$\frac{Z_1 \times Z_2}{X_1 \times X_2 + Y_1 \times Y_2} \times 100 = 1 \sim 190\% \quad (1)$$

in which $X_1$ represents a BET specific surface area (m²/g) of the ingredient (C); $X_2$ represents a content (g) of the ingredient (C); $Y_1$ represents a BET specific surface area (m²/g) of the ingredient (D); $Y_2$ represents a content (g) of the ingredient (D); $Z_1$ represents a minimum coverage area (m²/g) of the ingredient (E); and $Z_2$ represents a content (g) of the ingredient (E), provided that when a plurality of each of the ingredients (C) to (E) is contained, the designated value is a total value thereof.

2. The epoxy resin composition for an optical semiconductor device according to claim 1, wherein a cured material of the epoxy resin composition for an optical semiconductor device has a light reflectivity of 80% or more in a wavelength range of from 430 to 800 nm.

3. The epoxy resin composition for an optical semiconductor device according to claim 1, wherein the ingredient (E) is a silane coupling agent represented by the following general formula (1):

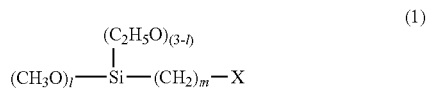

in which X represents a glycidyl group, a cyclohexene oxide group, a thiol group or an amino group; m represents any of 1, 2 or 3; and l represents any of 0, 1, 2 or 3.

4. The epoxy resin composition for an optical semiconductor device according to claim 1, wherein a cured material of the epoxy resin composition for an optical semiconductor device has a flexural strength of 60 MPa or more and a flexural elastic modulus of 10 GPa or more.

5. The epoxy resin composition for an optical semiconductor device according to claim 1, wherein the ingredient (C) is titanium dioxide.

6. The epoxy resin composition for an optical semiconductor device according to claim 1, wherein the ingredient (A) is an epoxy resin having an isocyanurate ring structure.

7. The epoxy resin composition for an optical semiconductor device according to claim 1, wherein the ingredient (B) is an acid anhydride curing agent.

8. The epoxy resin composition for an optical semiconductor device according to claim 1, further comprising a curing accelerator as an ingredient (F).

9. A lead frame for an optical semiconductor device, the lead frame having an optical semiconductor element mounding region and having a reflector that surrounds at least a part of the region,
wherein the reflector is formed from the epoxy resin composition for an optical semiconductor device according to claim 1.

10. The lead frame for an optical semiconductor device according to claim 9, wherein the reflector is formed on only one surface of the lead frame for an optical semiconductor device.

11. The lead frame for an optical semiconductor device according to claim 9, wherein the reflector is formed by transfer molding.

12. A substrate for an optical semiconductor device, the substrate having an optical semiconductor element mounding region and having a reflector that surrounds at least a part of the region,
wherein the reflector is formed from the epoxy resin composition for an optical semiconductor device according to claim 1.

13. The substrate for an optical semiconductor device according to claim 12, wherein the reflector is formed on only one surface of the substrate for an optical semiconductor device.

14. The substrate for an optical semiconductor device according to claim 12, wherein the reflector is formed by transfer molding.

15. An optical semiconductor device comprising:
    the lead frame for an optical semiconductor device according to claim 9; and
    an optical semiconductor element mounted on a prescribed position in the lead frame.

16. An optical semiconductor device comprising:
    the substrate for an optical semiconductor device according to claim 12; and
    an optical semiconductor element mounted on a prescribed position in the substrate.

* * * * *